United States Patent [19]
Kardokus

[11] Patent Number: 5,803,342
[45] Date of Patent: Sep. 8, 1998

[54] METHOD OF MAKING HIGH PURITY COPPER SPUTTERING TARGETS

[75] Inventor: Janine K. Kardokus, Otis Orchards, Wash.

[73] Assignee: Johnson Matthey Electronics, Inc., Spokane, Wash.

[21] Appl. No.: 780,166

[22] Filed: Dec. 26, 1996

[51] Int. Cl.[6] .................................................. B23K 31/00
[52] U.S. Cl. ...................... 228/173.2; 228/190; 228/193; 228/262.6
[58] Field of Search .................................. 228/190, 193, 228/173.2, 262.6

[56] References Cited

U.S. PATENT DOCUMENTS

| | | | |
|---|---|---|---|
| 4,468,313 | 8/1984 | Okumura et al. | 204/298 |
| 4,610,774 | 9/1986 | Sakata et al. | 204/298 |
| 4,752,335 | 6/1988 | Korb | 75/249 |
| 4,820,397 | 4/1989 | Fielder et al. | 204/298 |
| 4,826,584 | 5/1989 | dos Santos Pereiro Ribeiro | 204/298 |
| 4,838,935 | 6/1989 | Dunlop et al | 75/230 |
| 4,889,772 | 12/1989 | Bergmann et al. | 428/547 |
| 4,961,831 | 10/1990 | Bergmann et al. | 204/192.16 |
| 4,961,832 | 10/1990 | Shagun et al. | 204/298.07 |
| 4,963,239 | 10/1990 | Shimamura et al. | 207/192.12 |
| 4,963,240 | 10/1990 | Fukasawa et al. | 204/192.15 |
| 4,964,962 | 10/1990 | Nobutani et al. | 204/192.3 |
| 4,964,968 | 10/1990 | Arita | 204/298.19 |
| 4,964,969 | 10/1990 | Kasakabe et al. | 204/298.12 |
| 4,966,676 | 10/1990 | Fukasawa et al. | 204/298.12 |
| 4,966,677 | 10/1990 | Aichert et al. | 204/298.21 |
| 4,971,674 | 11/1990 | Hata | 204/192.12 |
| 5,066,381 | 11/1991 | Ohta et al. | 204/298.12 |
| 5,230,459 | 7/1993 | Mueller et al. | 228/164 |
| 5,397,050 | 3/1995 | Mueller | 228/193 |
| 5,595,337 | 1/1997 | Demaray et al. | 228/193 |

FOREIGN PATENT DOCUMENTS

| | | | |
|---|---|---|---|
| 63-270459 | 11/1988 | Japan . | |
| 1-104484 | 4/1989 | Japan | 228/193 |
| 1-283367 | 11/1989 | Japan . | |
| 1-301855 | 12/1989 | Japan . | |
| 2-8364 | 1/1990 | Japan . | |
| 1523284 | 11/1898 | U.S.S.R. | 228/193 |

OTHER PUBLICATIONS

Dunlop et al., "Effects of Ti–W Target Processing Methods on Defect Generation During VLSI Device Fabrication," American Vacuum Society 37th Annual Symposium and Topical Conferences, Toronto, Canada, Oct. 8–12, 1990.

*Primary Examiner*—Patrick Ryan
*Assistant Examiner*—Jeffrey T. Knapp
*Attorney, Agent, or Firm*—Christie, Parker & Hale, LLP

[57] ABSTRACT

Described is a method of making high purity copper sputtering target. The method avoids melting and casting and involves stacking segments of high purity copper plates, and heating, forging and annealing to produce a diffusion bonded unitary structure.

4 Claims, 1 Drawing Sheet

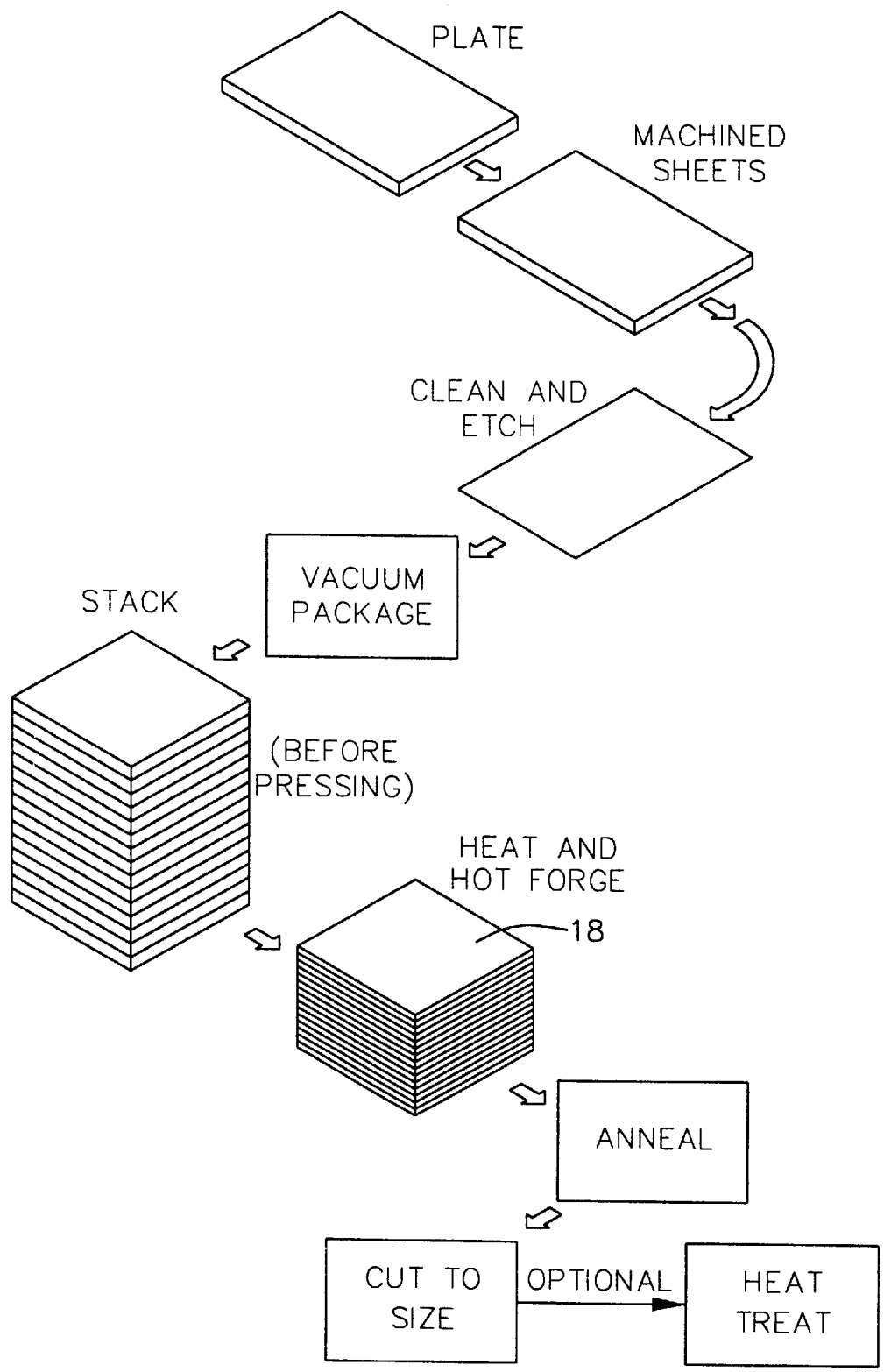

METHOD OF MAKING HIGH PURITY COPPER SPUTTERING TARGETS

FIELD OF THE INVENTION

The invention relates to a method of making a high purity sputtering target. More particularly, the invention relates to a method of making a high purity copper sputtering target that does not include casting.

BACKGROUND OF THE INVENTION

Magnetron sputtering is a well known technique used to deposit layers of metal or ceramic on a substrate. Sputtering targets comprise a sputtering target surface of a material to be "sputtered", i.e. to be deposited on a desired-substrate. Magnetron sputtering and sputtering targets used for sputtering, are well known.

A common method of making copper sputtering targets involves melting and casting, either static casting or continuous casting. Melting and casting processes require the use of expensive equipment. Moreover, there is the possibility that processes which involve melting copper increase the opportunity for introduction of impurities and adds to the difficulty of providing producing a copper target with high purity. Generally, the term "high purity" refers to a purity of greater than 99.99% and preferably at least 99.9999% purity.

Methods for refining copper by electroplating processes to produce high purity copper are well known. Normally, in the electroplating process copper is deposited uniformly as a flat layer in an electrolyte. However, an electroplating bath can be used for only a limited amount of time before the bath conditions become unstable and copper metal growth degenerates into nodular dendritic formations. Such problems may be avoided by use of long, slow, deposition times, but this may add to costs. It has been found that high purity copper sputtering targets can be made with electrodeposited copper by cleaning, melting and casting into a sufficiently large ingot to form a sputtering target. The present invention provides a method of making a high purity copper sputtering target by bypassing the casting process.

SUMMARY OF THE INVENTION

In accordance with the present invention there is provided a method of making high purity sputtering targets, and targets so produced, which comprises providing a plurality of segments of high purity copper plates produced by electrodeposition such that each segment has a bonding surface. The bonding surfaces are cleaned and the cleaned segments are arranged in a stack. The stacked segments are fixed in position to form an assembly and then heated and forged in an inert atmosphere such that the thickness of the stack is reduced. The forged assembly is annealed and a unitary structure comprising diffusion bonded segments is produced. The resulting unitary structure can be fabricated into a copper target or can be subjected to further deformation and heat treating to develop specific desired grain structures and textures, and then fabricated into a sputtering target.

BRIEF DESCRIPTION OF DRAWINGS

The accompanying drawing is a flow chart of a preferred embodiment of the invention.

DETAILED DESCRIPTION

The invention provides an alternative method of making high purity copper sputtering targets that avoids the need to melt and/or cast the metal in the manufacturing process. Thus, high purity sputtering targets may be produced without the added risk of introducing impurities or the need for expensive equipment generally used in melting and casting.

The accompanying illustration describes one embodiment of the process. A plurality of high purity copper plates is provided, preferably high purity copper plates produced by electroplating. Such high purity copper plates are obtained by cathodic deposition whereby copper is deposited substantially uniformly in a flat layer. The surface of each copper cathode plate is then machined to a suitable thickness, e.g. ⅛ inch, and cut to segments of desired size after which the segments are cleaned and vacuumed packaged into a stack. As an illustration, a standard cathode plate may be cut into uniform squares which are machined smooth on both sides to approximately 0.2 inches thickness. The squares are then cleaned and etched using a dilute nitric acid solution, rinsed in water and then rinsed in methanol after which they are dried, such as with an air gun, to prevent staining or spotting.

The stack of high purity copper segments are then fixed together, such as by drilling a hole through the stack and inserting a high purity copper pin into the hole. Advantageously, the drilling is done prior to cleaning and cleaned copper pins are used to hold the stack together.

The assembly of stacked high purity copper segments is then heated to an elevated temperature, e.g. about 932° F., preferably in an inert gas atmosphere and forged to reduce the thickness of the assembly, preferably to about ½ the original height of the stack. The forged assembly is then annealed, e.g. at 932° F. in an inert gas atmosphere for about 24 hours, to produce a diffusion-bonded unitary structure. After cooling, the copper structure can be cut to size and then made directly into a copper sputtering target or can be subjected to further deformation and heat treating to obtain specific desired grain structures and textures.

As an alternative to the process described above, the segments of high purity copper may be stacked before being subjected to a vacuum and may be fixed together by packaging in a metal foil or other suitable protective cover. The fixed assembly of stacked high purity copper segments may be hot forged to the desired reduction in thickness, i.e. about ½ the original height, in a ½ ton hot forging press, for example about 500° C.,±50° C. A layer or plate of protective material may be placed at the top and bottom of the stack as protection for the segments, if desired. Also, following annealing, it may be desireable to cold roll the unitary structure, e.g. 70 to 90% reduction, and subsequently heat treated to develop desired metallurgical properties.

It should also be noted that forms of high purity copper segments other than plates produced by electrodeposition may be used. For example, segments of hot pressed and sintered high purity copper may also be useful within the scope of the invention.

It is apparent from the foregoing that various changes and modifications may be made without departing from the invention.

What is claimed is:

1. A method of making a high purity copper sputtering target comprising:

providing a plurality of segments of high purity copper plates, each of said segments having bonding surfaces;

cleaning the bonding surfaces;

arranging the segments in a stack with bonding surfaces adjacent each other;

fixing the stacked segments in position to form an assembly;

heating and forging the assembly in an inert atmosphere whereby the thickness of the stack is reduced; and annealing the forged assembly to produce a diffusion bonded unitary structure.

2. A method according to claim 1 wherein the stacked segments are fixed by drilling at least one hole through the stack and inserting a high purity copper pin through the hole to fix the stacked segments.

3. A method according to claim 1 further comprising cooling and fabricating the forged and annealed assembly to desired shape and size of the sputtering target.

4. A method according to claim 1 wherein said high purity copper is produced by electrodeposition.

* * * * *